(12) United States Patent
Obata

(10) Patent No.: US 11,049,821 B2
(45) Date of Patent: Jun. 29, 2021

(54) CIRCUIT MODULE

(71) Applicant: Murata Manufacturing Co., Ltd., Kyoto (JP)

(72) Inventor: Takayoshi Obata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 133 days.

(21) Appl. No.: 16/275,489

(22) Filed: Feb. 14, 2019

(65) Prior Publication Data

US 2019/0181101 A1 Jun. 13, 2019

Related U.S. Application Data

(63) Continuation of application No. PCT/JP2017/030045, filed on Aug. 23, 2017.

(30) Foreign Application Priority Data

Aug. 23, 2016 (JP) .............................. JP2016-163124

(51) Int. Cl.
*H01L 23/31* (2006.01)
*H01L 23/00* (2006.01)
(Continued)

(52) U.S. Cl.
CPC ............ *H01L 23/562* (2013.01); *H01L 23/13* (2013.01); *H01L 23/145* (2013.01);
(Continued)

(58) Field of Classification Search
CPC ......... H01L 21/56–568; H01L 23/3192; H01L 23/3135; H01L 23/3142;
(Continued)

(56) References Cited

U.S. PATENT DOCUMENTS

2007/0228532 A1 10/2007 Echols et al.
2011/0068467 A1 3/2011 Ozaki
(Continued)

FOREIGN PATENT DOCUMENTS

JP H05-090957 U 12/1993
JP 2001-319211 A 11/2001
(Continued)

OTHER PUBLICATIONS

International Search Report for International Application No. PCT/JP2017/030045 dated Nov. 7, 2017.
(Continued)

*Primary Examiner* — Jeremy C Norris

(74) *Attorney, Agent, or Firm* — Pearne & Gordon LLP

(57) ABSTRACT

Breakage of a board due to local concentration of stress at the time when a circuit module deforms is reduced. A circuit module includes a base, a lower layer, and a surface layer. The base has a mounting region in which an electronic component is mounted. The lower layer is made of a resin material. The lower layer is formed over from the mounting region to a region other than the mounting region on the base. The surface layer is made of a resin material different in hardness from the resin material of the lower layer. A periphery of the surface layer is located outside the mounting region and inside a region in which the lower layer is formed.

15 Claims, 7 Drawing Sheets

(51) Int. Cl.
   *H05K 1/02* (2006.01)
   *H05K 3/28* (2006.01)
   *H01L 23/13* (2006.01)
   *H01L 23/14* (2006.01)
   *H01L 23/498* (2006.01)

(52) U.S. Cl.
   CPC ...... *H01L 23/3121* (2013.01); *H01L 23/3135* (2013.01); *H01L 24/16* (2013.01); *H05K 1/02* (2013.01); *H05K 3/28* (2013.01); *H01L 23/4985* (2013.01); *H01L 24/13* (2013.01); *H01L 24/81* (2013.01); *H01L 24/92* (2013.01); *H01L 2224/13101* (2013.01); *H01L 2224/13144* (2013.01); *H01L 2224/16225* (2013.01); *H01L 2224/8185* (2013.01); *H01L 2224/81815* (2013.01); *H01L 2224/92125* (2013.01); *H01L 2924/181* (2013.01); *H01L 2924/19105* (2013.01); *H01L 2924/351* (2013.01)

(58) Field of Classification Search
   CPC ........... H05K 1/185–188; H05K 1/183; H05K 2201/1056
   USPC .................................. 361/792–795; 174/260
   See application file for complete search history.

(56) References Cited

U.S. PATENT DOCUMENTS

2012/0119372 A1\* 5/2012 Yasukawa ............... H01L 23/38
   257/773
2013/0307163 A1\* 11/2013 Inoue .................... H01L 21/563
   257/777

FOREIGN PATENT DOCUMENTS

| JP | 2008-21933 A | 1/2008 |
| JP | 2011-71234 A | 4/2011 |
| JP | 2013-197564 A | 9/2013 |
| JP | 2013-239660 A | 11/2013 |

OTHER PUBLICATIONS

Written Opinion for International Application No. PCT/JP2017/030045 dated Nov. 7, 2017.

\* cited by examiner

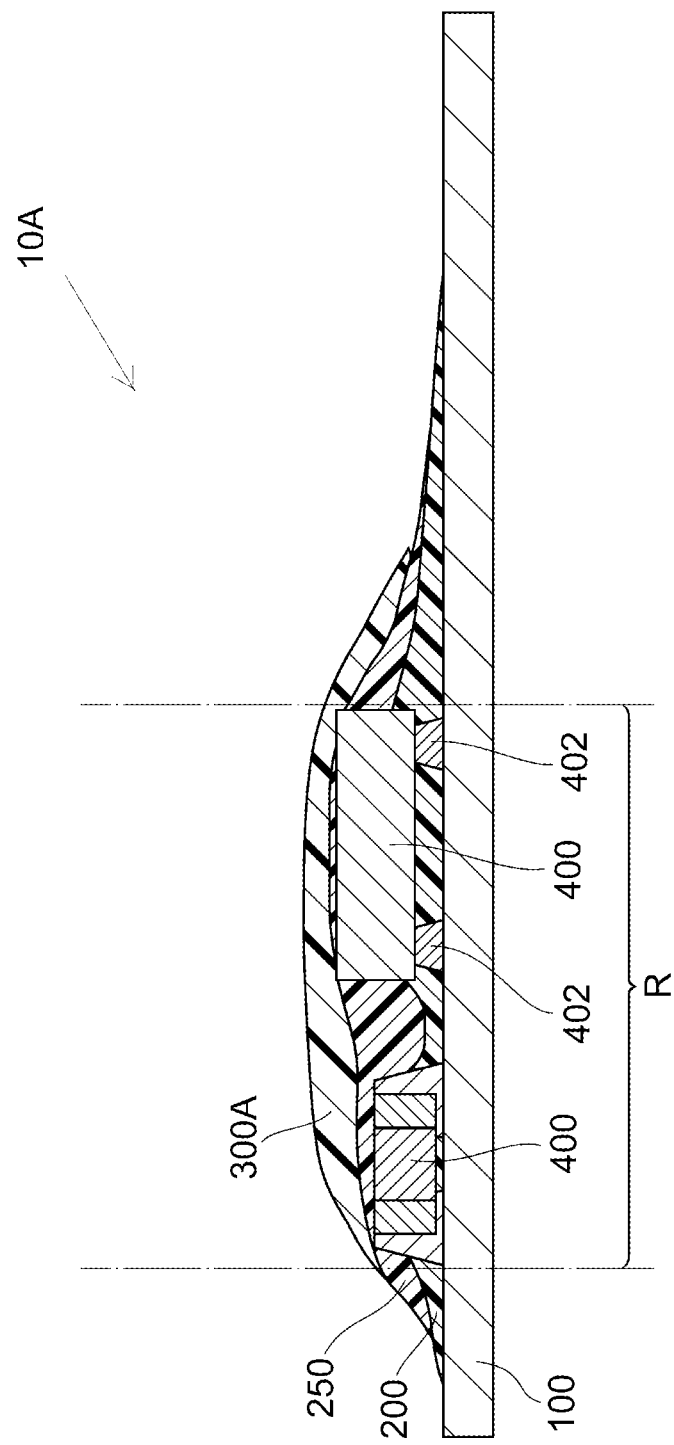

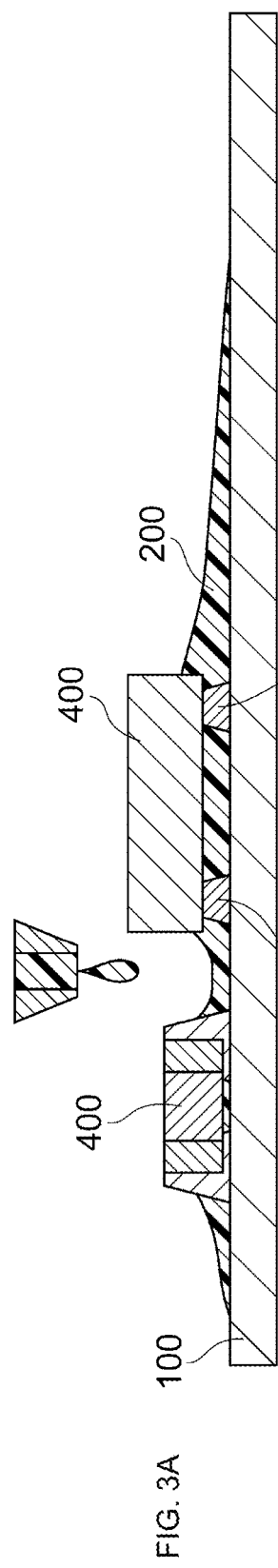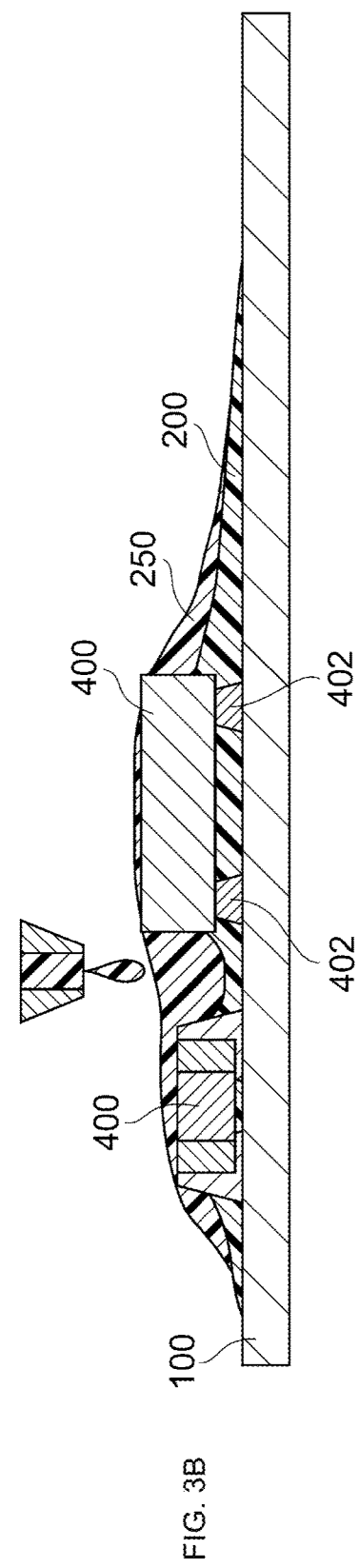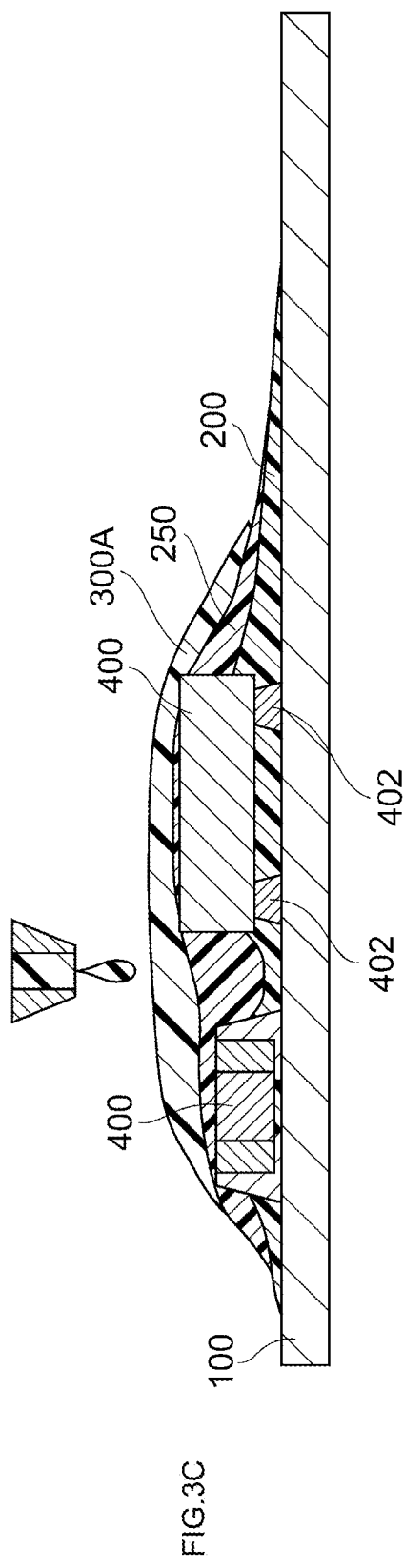

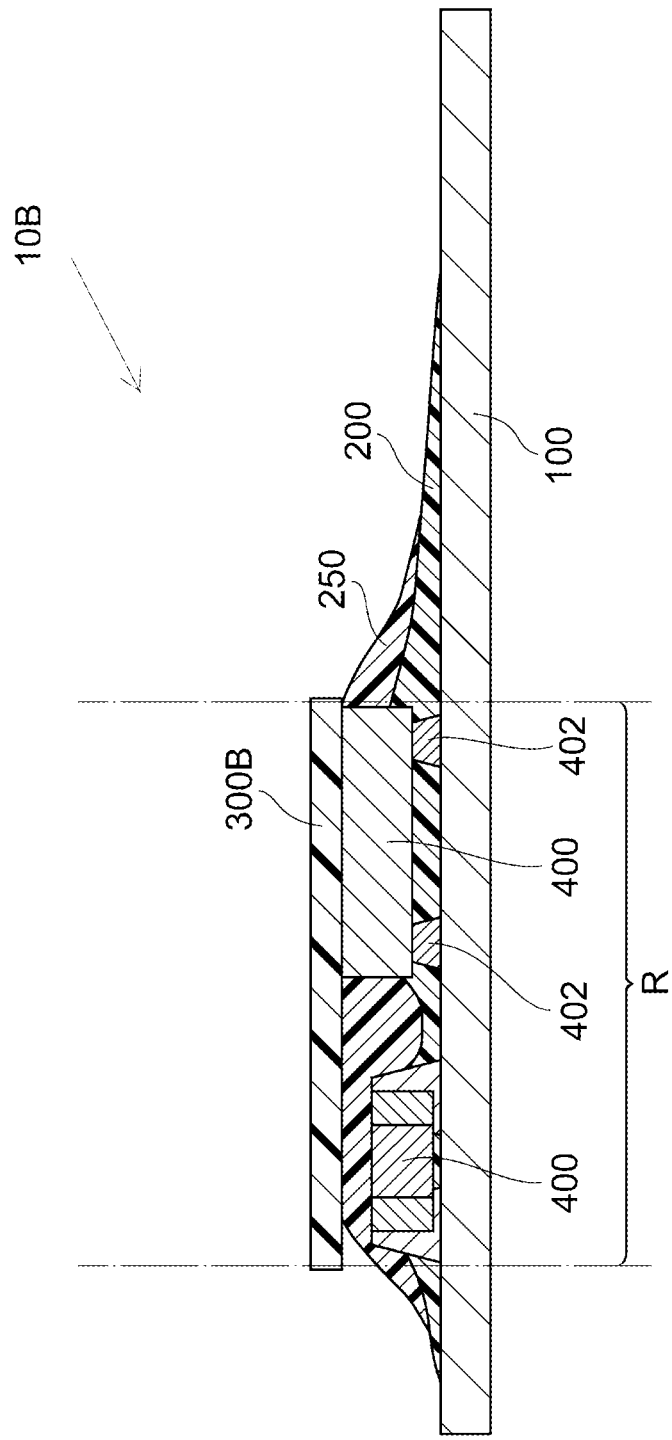

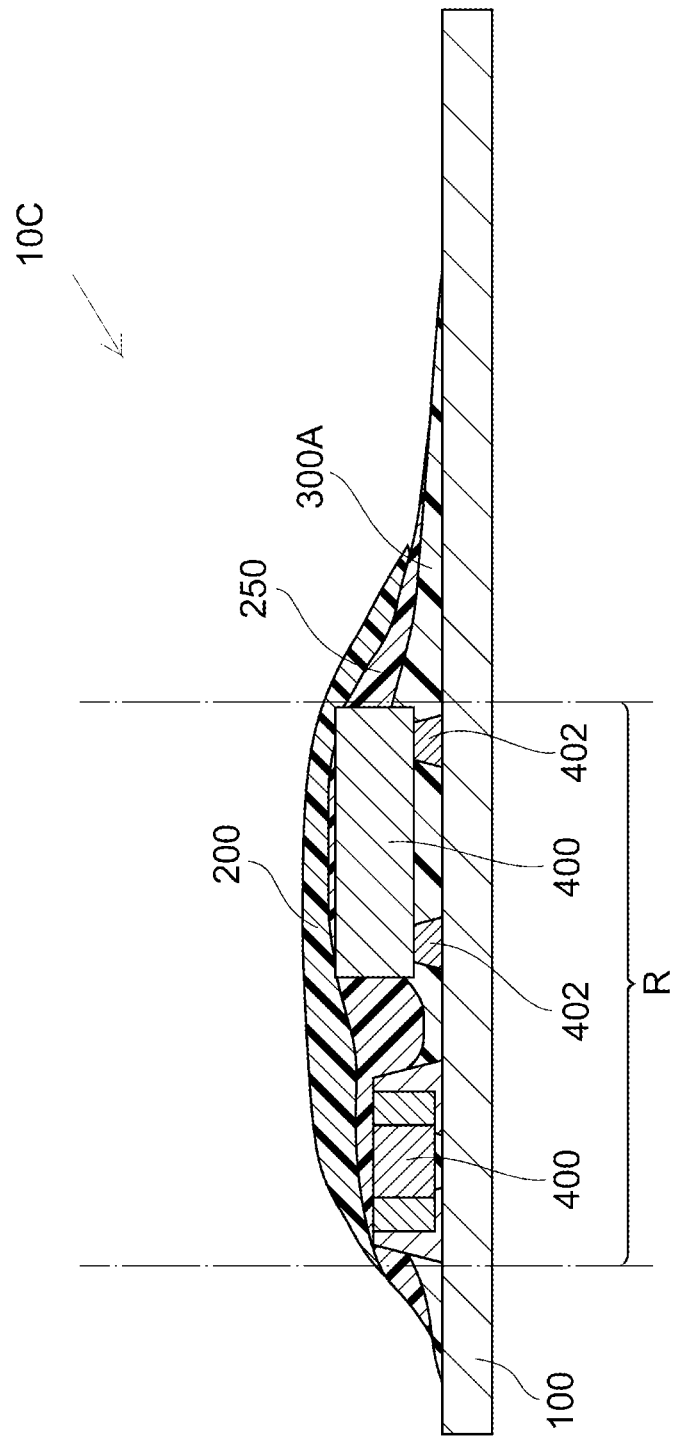

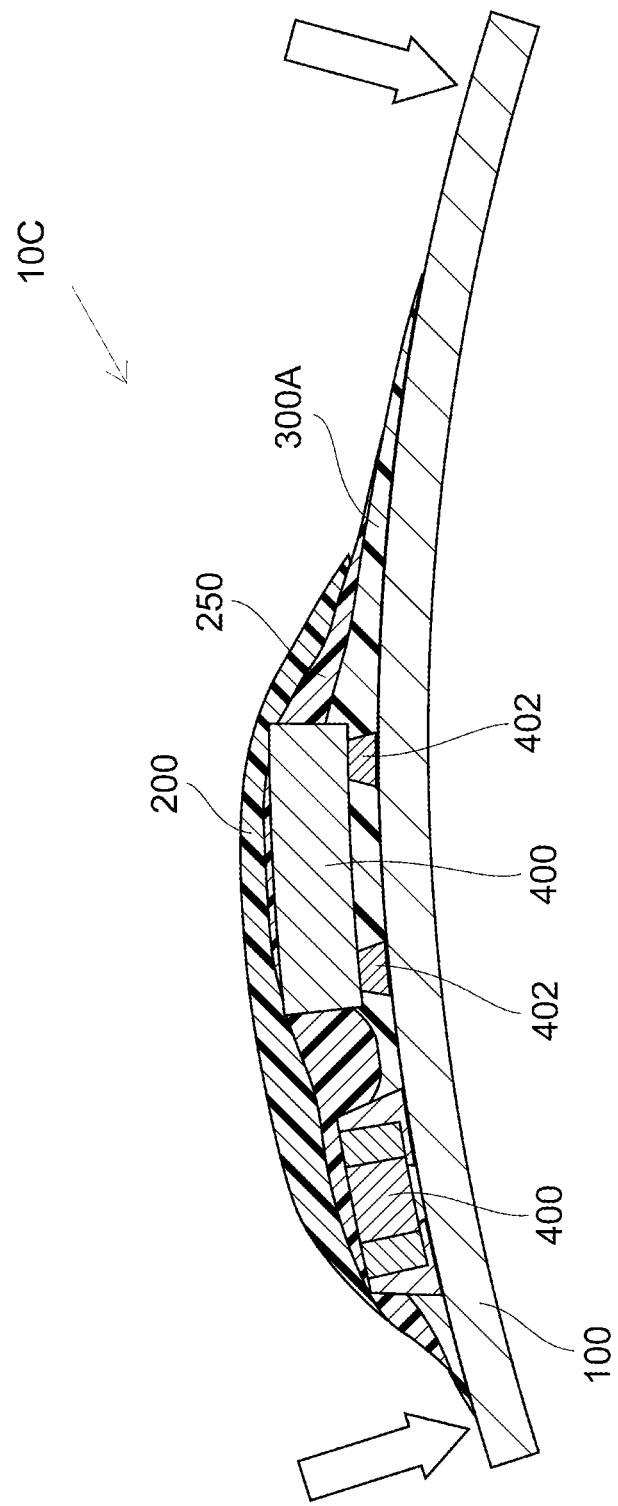

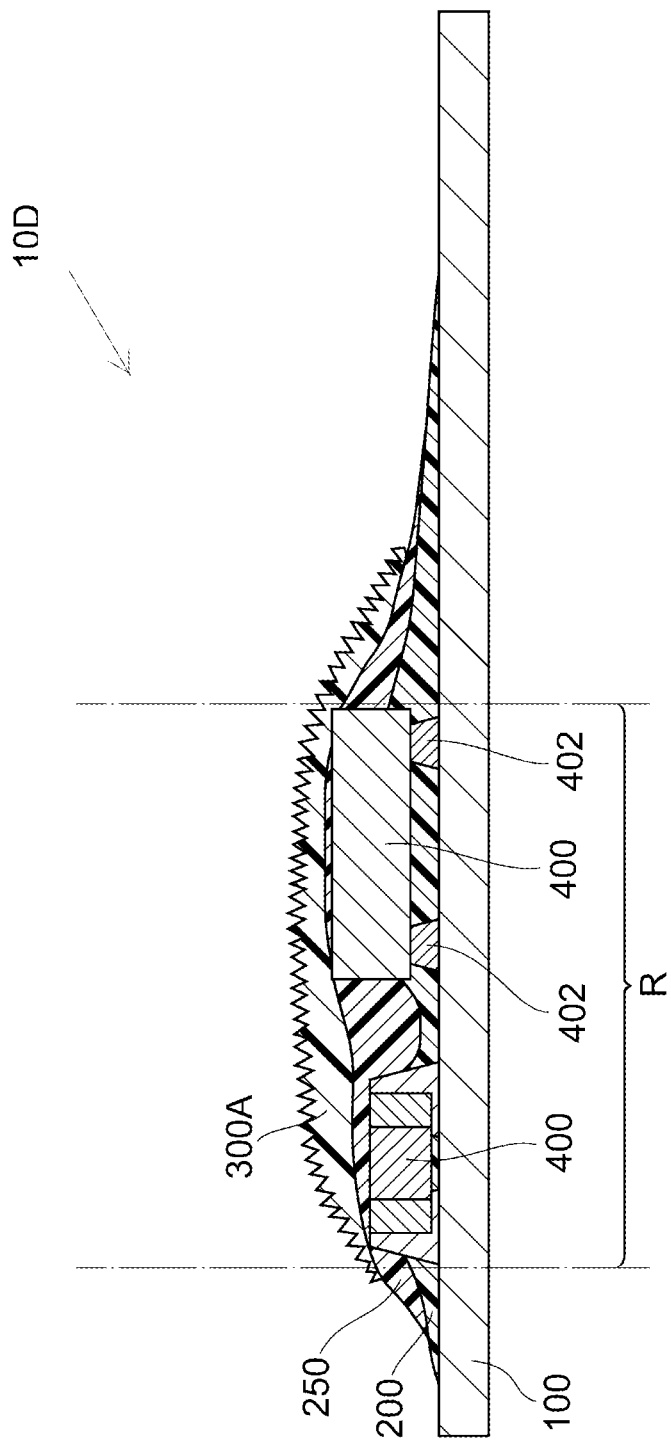

CIRCUIT MODULE

This is a continuation of International Application No. PCT/JP2017/030045 filed on Aug. 23, 2017 which claims priority from Japanese Patent Application No. 2016-163124 filed on Aug. 23, 2016. The contents of these applications are incorporated herein by reference in their entireties.

BACKGROUND OF THE DISCLOSURE

Field of the Disclosure

The present disclosure relates to a circuit module.

Description of the Related Art

In recent years, electronic components have been more and more reduced in size and thickness. Accordingly, flexible boards having flexibility have come to attention as boards in which electronic components are mounted. Since flexible boards in which electronic components are mounted are allowed to be used in a bent form, the flexible boards are allowed to be used in various situations where bendability is required.

Patent Document 1 describes a coating structure of a flip chip of which the degradation of moisture resistance is inhibited. A structure described in Patent Document 1 includes a semiconductor element, a circuit board, a low-viscous resin layer, and a high-viscous resin layer. Bumps made of Au, solder, or another material, are formed on the semiconductor element by plating, or the like. The circuit board is provided with a circuit portion. The bumps are mounted in a state where conductive adhesive or solder is supplied in advance to the predetermined locations of the circuit portion, and the bumps are electrically connected to the circuit portion by solidification or reflowing. The low-viscous resin layer is formed by applying a low-molecular, low-viscous (for example, a viscosity of approximately 500 poise) resin in any gap between the semiconductor element and the circuit board while being heated and then curing the resin. The high-viscous resin layer is formed by applying a high-molecular, high-viscous (for example, a viscosity of approximately 1500 poise) resin so as to cover the semiconductor element and the low-viscous resin layer and then curing the resin.

Patent Document 1: Japanese Unexamined Utility Model Registration Application Publication No. 5-090957

BRIEF SUMMARY OF THE DISCLOSURE

In the flip chip described in Patent Document 1, the resin in the outermost surface layer also covers the side surface of the resin in the lower layer, and is in contact with the circuit board at its end portion. In addition, a contact angle that the end portion of the resin in the outermost surface layer forms with the circuit board is substantially perpendicular. In this way, in the coating structure of the flip chip described in Patent Document 1, hardness steeply varies at the periphery of the resin. For this reason, when a flexible board having flexibility is used as the circuit board in the coating structure of the flip chip as described in Patent Document 1, if the circuit board is bent or expanded or contracted, stress concentrates on the contact portion between the resin in the outermost surface layer and the circuit board. As a result, the circuit board intensively deforms at the contact portion, so the circuit board or a wiring circuit formed on the surface of the circuit board may be damaged.

The present disclosure is made in view of such a situation, and it is an object of the present disclosure to provide a circuit module that reduces the breakage of a board due to local concentration of stress at the time when the board deforms.

A circuit module according to one aspect of the present disclosure includes a base, a lower layer, and a surface layer. The base has a mounting region in which an electronic component is mounted. The lower layer is made of a resin material. The lower layer is formed over from the mounting region to a region other than the mounting region on the base. The surface layer is made of a resin material different in hardness from the resin material of the lower layer. A periphery of the surface layer is located outside the mounting region and inside a region in which the lower layer is formed.

According to the present disclosure, it is possible to reduce the breakage of a board due to the local concentration of stress at the time when the board deforms.

BRIEF DESCRIPTION OF THE SEVERAL VIEWS OF THE DRAWINGS

FIG. 1 is a cross-sectional view that schematically shows the structure of a circuit module 10A according to a first embodiment of the present disclosure.

Figure 2A:
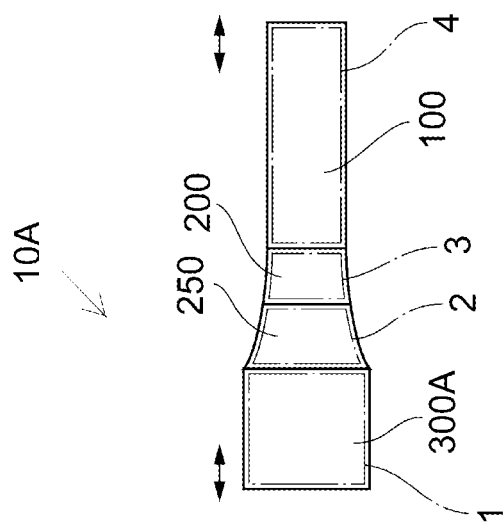
Figure 2B:
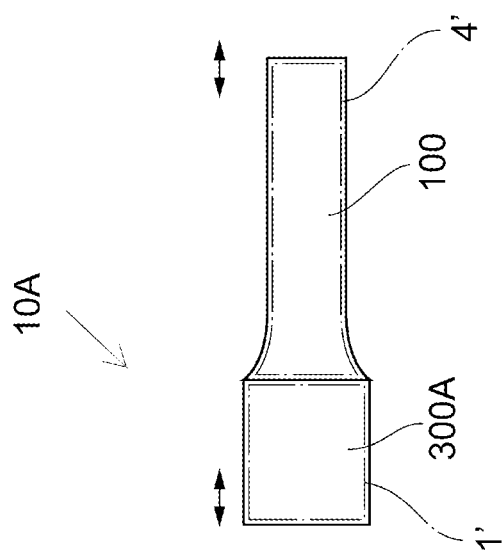

Each of FIGS. 2A and 2B is a schematic view for illustrating a function of the circuit module 10A.

Each of FIGS. 3A, 3B and 3C is a schematic view that shows an example of a manufacturing method for the circuit module 10A.

FIG. 4 is a view that schematically shows the structure of a circuit module 10B according to a second embodiment of the present disclosure.

FIG. 5 is a cross-sectional view that schematically shows the structure of a circuit module 10C according to a third embodiment of the present disclosure.

FIG. 6 is a schematic view that shows a behavior in the case where the circuit module 10C is bent.

FIG. 7 is a cross-sectional view that schematically shows the structure of a circuit module 10D according to a fourth embodiment of the present disclosure.

DETAILED DESCRIPTION OF THE DISCLOSURE

First Embodiment

Hereinafter, a first embodiment of the present disclosure will be described with reference to the accompanying FIG. 1 to FIG. 3C.

1. Configuration of Circuit Module 10A

FIG. 1 is a cross-sectional view that shows a configuration example of a circuit module 10A according to the first embodiment of the present disclosure. As shown in FIG. 1, the circuit module 10A includes a base sheet (an example of a base) 100, a resin layer 200 (an example of a lower layer), a resin layer 250 (an example of an intermediate layer), and a hard resin layer 300A (an example of a surface layer).

The base sheet 100 is a flexible sheet, such as polyurethane and polyethylene terephthalate. That is, the base sheet 100 bends, curves, or expands or contracts. The base sheet 100 has a mounting region R in which wiring electrodes are formed and a plurality of electronic components 400 is mounted. The mounting region R means a region in which the plurality of mounted electronic components 400 is provided. The wiring electrodes are formed by using, for example, conductive paste including a binder component such as silicone.

At least part of the plurality of electronic components 400 is mounted on the base sheet 100 with bumps 402 interposed therebetween. The bumps 402 are made of solder, or the like. Therefore, a predetermined space (for example, approximately larger than or equal to 50 µm and smaller than or equal to 100 µm) is formed between the at least part of the electronic components 400 and the base sheet 100.

The resin layer 200 is formed over a region other than the mounting region R on the base sheet 100. In addition, the resin layer 200 is filled in any gap between the electronic components 400 and the base sheet 100. The resin layer 200 has such a shape (fillet shape) that the thickness of a portion formed outside the mounting region R decreases toward the periphery of the portion. In addition, a contact angle of the periphery of the resin layer 200 contacting with the base sheet 100 is an acute angle.

The resin layer 200 preferably has a low hardness approximately lower than Shore A20 after being cured. As an example, the resin layer 200 is made of silicone, urethane, acrylic, or the like. Alternatively, the resin layer 200 may be made of dispersed elastomer particles. Shore hardness is the one measured by a durometer hardness test based on JIS A 6253 or ISO 7619.

The resin layer 250 is formed on the surface of the resin layer 200 such that the periphery of the resin layer 250 is located outside the mounting region R and inside a region in which the resin layer 200 is formed. In the resin layer 250, as well as the resin layer 200, a portion formed outside the mounting region R has a fillet shape. The periphery of the resin layer 250 may be provided at a location that coincides with the periphery of the resin layer 200.

The resin layer 250 preferably is higher in hardness than the resin layer 200 and lower in hardness than the hard resin layer 300A (described later) after being cured. In this specification, whether the hardness is high or low is determined based on a numeric value of Shore hardness. For example, the resin layer 250 is made of silicone, urethane, acrylic, or the like.

In the example of FIG. 1, the thickness of the resin layer 250 is adjusted such that the total thickness of the resin layer 250 and the resin layer 200 is larger than the thickness of the corresponding electronic component 400 in the mounting region R. When the thickness of the resin layer 200 is sufficient to cover the electronic components 400, a flexible board 10A does not have to include the resin layer 250. When the total thickness of the resin layer 200 and the resin layer 250 is not sufficient to cover the electronic components 400, the circuit module 10A may include a plurality of the resin layers 250.

The hard resin layer 300A is formed on the surface of the resin layer 250 such that the periphery of the hard resin layer 300A is located outside the mounting region R and inside a region in which the resin layer 250 is formed. A portion formed in the mounting region R in the hard resin layer 300A has a flat surface. The hard resin layer 300A as well as the resin layers 200, 250 may be formed such that the thickness of a portion formed outside the mounting region R decreases toward the periphery of the portion. In FIG. 1, the hard resin layer 300A is formed on the surface of the resin layer 250 in a range wider than the mounting region R and narrower than the range in which the resin layer 250 is formed. The hard resin layer 300A should be formed at least in the mounting region R.

The hard resin layer 300A is made of a resin higher in hardness than the resin layers 200, 250. For example, the hard resin layer 300A is preferably approximately higher than or equal to D70 and lower than or equal to D90 in Shore hardness, and higher than or equal to M90 in Rockwell hardness. Examples of the material of the hard resin layer 300A include silicone, urethane, and acrylic. Since the circuit module 10A according to the present embodiment includes the formed hard resin layer 300A in the mounting region R, it is possible to achieve the protection not only when the mounted electronic components 400 are pressed from above but also against the stress that partially acts as a result of bending or expansion or contraction.

The thickness of the hard resin layer 300A preferably falls within the range larger than or equal to 18 µm and smaller than or equal to 75 µm. This is because a load distribution effect caused by the hard resin layer 300A tends to decrease when the thickness of the hard resin layer 300A is smaller than 18 µm and the bendability of the overall circuit module 10A tends to decrease when the thickness of the hard resin layer 300A exceeds 75 µm. The thickness of the hard resin layer 300A is measured at a thinnest portion in the top surfaces of the electronic components 400.

In this way, in the circuit module 10A according to the present embodiment, in the resin layers 200, 250, the portion formed outside the mounting region R has such a fillet shape that the thickness decreases toward its periphery. For this reason, the circuit module 10A has a gentle gradient from the mounting region R toward an end portion.

2. Function

The function of the circuit module 10A will be described with reference to FIGS. 2A and 2B. Each of FIGS. 2A and 2B is a view that shows a top view of part of an expanded and contracted board 10A' according to a comparative embodiment and part of the expanded and contracted circuit module 10A according to the present embodiment. In FIGS. 2A and 2B, the electronic components 400 are not shown. The arrows shown in FIGS. 2A and 2B indicate directions in which the circuit modules 10A are expanded or contracted.

FIG. 2A shows a state where the board 10A' according to the comparative embodiment is expanded or contracted. The board 10A' includes the base sheet 100 and the hard resin layer 300A. Electronic components (not shown) are mounted on the base sheet 100. Since the hard resin layer 300A is a layer made of a resin having a high hardness, high restraint force develops at the time of expansion or contraction in a region 1' where the hard resin layer 300A is formed in the board 10A'. On the other hand, in a region 4' where no hard resin layer 300A is formed in the board 10A', the board 10A' is able to freely expand or contract by exhibiting expansion and contraction properties inherent in the base sheet 100. Therefore, in the board 10A', there is a large difference in expansion and contraction properties at the boundary between the region 1' and the region 4'. This will result in, when the board 10A' is expanded or contracted, the development of a large deformation such as a constriction at the boundary between the region 1' and the region 4'.

FIG. 2B shows a state where the circuit module 10A according to the present embodiment is expanded or contracted. In the circuit module 10A, a region 2 in which the resin layer 250 is exposed and a region 3 in which the resin layer 200 is exposed are provided between a region 1 in which the hard resin layer 300A is formed and a region 4 in which no hard resin layer 300A is formed. The region 1 is sealed by the hard resin layer 300A, the resin layer 250, and the resin layer 200. The region 2 is sealed by the resin layer 250 and the resin layer 200. The region 3 is sealed by the resin layer 200.

As described above, the resin layer 250 is lower in hardness than the hard resin layer 300A, and the resin layer 200 is much lower in hardness than the resin layer 250. Therefore, in the circuit module 10A, the restraint force becomes gentler in a stepwise manner from the region 1 to the region 4. This makes it possible to reduce the concentration of stress at the boundary between the regions when the circuit module 10A is expanded or contracted.

Furthermore, in the circuit module 10A according to the present embodiment, each of the resin layer 200 and the resin layer 250 has such a fillet shape that the thickness decreases from the mounting region R toward a region at the end portion of the circuit module 10A. For this reason, it is possible to obtain a gentle difference in the restraint force (difference in expansion and contraction properties) at the boundary between the regions 1 to 4.

This makes it possible to further reduce the concentration of stress at the boundary between the regions at the time when the circuit module 10A expands or contracts.

Moreover, in the circuit module 10A according to the present embodiment, the region in which the electronic components 400 are mounted is covered with the formed hard resin layer 300A. Therefore, the circuit module 10A is able to protect the mounted electronic components 400 against not only a flat load but also a concentrated load.

3. Manufacturing Method

Next, a manufacturing method for the circuit module 10A will be described. FIGS. 3A, 3B and 3C are a process flow that shows an example of the manufacturing method for the circuit module 10A according to the present embodiment.

First, in a process shown in FIG. 3A, liquid resin that is the material of the resin layer 200 is applied in a region where the electronic components 400 are mounted and around the region on the base sheet 100. A material having such a viscosity that the material is able to enter any gap between the electronic components 400 and the base sheet 100 based on capillarity and is able to form a thin fillet on the base sheet 100 is used as the liquid resin that is used at this time. Specifically, a material having a viscosity of approximately 100 mPa·s is preferably used.

When the liquid resin that is the material of the resin layer 200 is applied, no bank, or the like, is provided, and a range in which the resin layer 200 spreads to wet is adjusted with the use of the amount, wettability, viscosity, and the like, of the liquid resin to be applied. The liquid resin that is the material of the resin layer 200 is applied onto the base sheet 100 and then cured by heat, moisture, or the like.

Next, in a process shown in FIG. 3B, liquid resin that is the material of the resin layer 250 is applied onto the surface of the cured resin layer 200. In this case as well, no bank, or the like, is provided, and adjustment is made such that the resin layer 250 does not spread to wet to the outside of the resin layer 200 and is able to form a thin fillet with the use of the amount, wettability, viscosity, and the like, of the liquid resin to be applied. Specifically, the liquid resin that is used at this time is preferably a material higher in viscosity than the material of the resin layer 200 and having a viscosity of approximately 100 mPa·s to several Pa·s. Depending on the viscosity, the liquid resin is applied in the amount by which the shape of the liquid resin spreading to wet is formed inside approximately 1 mm or more from the outer periphery of the resin layer 200. The liquid resin that is the material of the resin layer 250 is applied onto the resin layer 200 and then cured by heat, moisture, or the like.

Next, in a process shown in FIG. 3C, liquid resin that is the material of the hard resin layer 300A is applied onto the surface of the cured resin layer 250. In this case as well, no bank, or the like, is provided, and adjustment is made such that the hard resin layer 300A covers the region in which the electronic components 400 are mounted and does not spread to wet to the outside of the resin layer 250 with the use of the amount, wettability, viscosity, and the like, of the liquid resin to be applied. The liquid resin that is used at this time is preferably a material higher in viscosity than the material of the resin layer 250 and having a viscosity of approximately several Pa·s or higher. Depending on the viscosity, the liquid resin is applied in the amount by which the shape of the liquid resin spreading to wet is formed inside approximately 1 mm or more from the outer periphery of the resin layer 250. The hard resin layer 300A is applied onto the resin layer 250, and then the surface of the hard resin layer 300A is flattened. After that, the hard resin layer 300A is cured by heat, moisture, or the like.

In this way, in the circuit module 10A according to the present embodiment, the hard resin layer 300A higher in hardness than the resin layer 200 is formed over the region in which the electronic components 400 are mounted. Thus, even when a concentrated load is applied, the load is distributed by the hard resin layer 300A, so it is possible to reduce the breakage of the electronic components 400. In addition, the hardness and thickness of each of the resin layer 200, the resin layer 250, and the hard resin layer 300A are arranged such that the outer periphery of each layer has a gentle gradient. Thus, it is possible to reduce the concentration of stress at the time when the circuit module 10A expands or contracts, and reduce the rupture of a circuit in the circuit module 10A.

Second Embodiment

In a second embodiment and the following embodiments, the description of common matters with the first embodiment is omitted, and only the differences will be described. Particularly, similar operation and advantageous effects of similar components will not be referred to one by one for each embodiment.

FIG. 4 is a cross-sectional view that shows a configuration example of a circuit module 10B that is an alternative embodiment of the circuit module 10A. Like reference signs denote components similar to those of the circuit module 10A shown in FIG. 1, and the description of the similar components is omitted.

As shown in FIG. 4, the circuit module 10B includes a hard sheet (an example of a surface layer) 300B instead of the hard resin layer 300A in the circuit module 10A.

The hard sheet 300B is formed on the surface of the resin layer 200. The hard sheet 300B should be formed on the surface of the resin layer 200 at least over the region in which the electronic components 400 are mounted. Specifically, the hard sheet 300B is formed as a single sheet having substantially a constant thickness in a region wider than the region in which the electronic components 400 are mounted and narrower than the resin layer 250. In addition, the hard sheet 300B is made of a material having a higher rigidity than the resin layer 250. The hard sheet 300B preferably has expansion and contraction properties and bendability.

In this way, with the circuit module 10B, by having the outermost surface layer formed of the hard sheet 300B, it is possible to achieve high flatness while omitting a process of flattening the surface and a process of curing the outermost surface layer.

The other components and functions of the circuit module 10B are similar to those of the circuit module 10A.

Third Embodiment

Another embodiment of the present disclosure will be described with reference to FIG. 5 and FIG. 6. Like reference signs denote components similar to those of the flexible board 10A shown in FIG. 1, and the description of the similar components is omitted.

FIG. 5 is a cross-sectional view that shows a configuration example of a circuit module 10C that is an alternative embodiment of the circuit module 10A. As shown in FIG. 5, the circuit module 10C has such a configuration that the materials of the lowermost layer and outermost surface layer in the circuit module 10A are interchanged. That is, the flexible board 10C includes the hard resin layer 300A in the lowermost layer, and includes the resin layer 200 in the outermost surface layer. In this way, the layers are laminated in descending order of hardness from the lower layer toward the surface layer. The other components of the circuit module 10C are similar to the components of the circuit module 10A.

FIG. 6 is a view that schematically shows a behavior at the time when the circuit module 10C is bent.

In FIG. 6, the arrow indicates the direction of the external pressure applied to the circuit module 10C. In the flexible board 10C, since the lowermost layer is the hard resin layer 300A, the rigidity of the lowermost layer increases. On the other hand, by forming the hard resin layer 300A into a thin fillet shape, the flexible board 10C gains the flexibility gently toward the end portion although the flexible board 10C is hard. Therefore, when the external force that bends the circuit module 10C acts on the flexible board 10C, the hard resin layer 300A deforms to bend. On the other hand, the resin layer 200 having flexibility undergoes shear deformation. This allows the circuit module 10C to bend without interference caused by the hard resin layer 300A when the external force acts on the circuit module 10A.

Fourth Embodiment

Another embodiment of the present disclosure will be described with reference to FIG. 7. Like reference signs denote components similar to those of the circuit module 10A shown in FIG. 1, and the description of the similar components is omitted.

FIG. 7 is a cross-sectional view that shows a configuration example of a circuit module 10D that is an alternative embodiment of the circuit module 10A. As shown in FIG. 7, the circuit module 10D has asperities at the surface of the hard resin layer 300A in the circuit module 10A. The other components of the circuit module 10D are similar to the components of the circuit module 10A. Since the circuit module 10D includes the hard resin layer 300A having asperities at its surface, the circuit module 10D easily bends or curves. Asperities should be formed in the hard resin layer 300A. Alternatively, asperities may also be formed at the surface of the resin layer 200 or the surface of the resin layer 250. Asperities can be formed by graining in which asperities are molded with a die having asperities.

The exemplary embodiments of the present disclosure are described above. The flexible board 10A according to one embodiment of the present disclosure includes the base sheet 100, the resin layer 200, and the hard resin layer 300A (FIG. 1). The base sheet 100 has the mounting region R in which the electronic components 400 are mounted. The resin layer 200 is made of a resin material and is formed over from the mounting region R to the region other than the mounting region R on the base sheet 100. The hard resin layer 300A is made of a resin material different in hardness from the resin layer 200, and the periphery of the hard resin layer 300A is located outside the mounting region R and inside the region in which the resin layer 200 is formed. Therefore, in the circuit module 10A, the restraint force becomes gentler in a stepwise manner from the region in which the hard resin layer 300A is formed to the region in which no resin layer 200 is formed. This makes it possible to reduce the concentration of local stress at the time when the circuit module 10A deforms.

Preferably, the resin layer 200 has such a shape that the thickness of the portion formed outside the mounting region R decreases toward the periphery of the resin layer 200, and a contact angle of the periphery of the resin layer 200 contacting with the base sheet 100 is an acute angle. According to this preferred embodiment, a difference in the restraint force from the region in which the hard resin layer 300A is formed to the region in which no resin layer 200 is formed becomes further gentle. This makes it possible to further reduce the local concentration of stress at the time when the circuit module 10A deforms.

Preferably, the circuit module 10A further includes the resin layer 250. The resin layer 250 is made of a resin material. The resin layer 250 is formed between the resin layer 200 and the hard resin layer 300A. The periphery of the resin layer 250 is located outside the region in which the hard resin layer 300A is formed and inside the region in which the resin layer 200 is formed. The resin layer 250 is formed such that the total thickness of the resin layer 200 and the resin layer 250 in the mounting region R is at least larger than the thickness of the corresponding electronic component 400. According to this preferred embodiment, a difference in the restraint force from the region in which the hard resin layer 300A is formed to the region in which no resin layer 200 is formed becomes further gentle. This makes it possible to further reduce the local concentration of stress at the time when the circuit module 10A deforms.

In the circuit module 10A, the hardness preferably varies in a stepwise manner from the resin layer 200 toward the hard resin layer 300A. In this case, the layers may be laminated from the resin layer 200 toward the hard resin layer 300A in any one of ascending order of the hardness (FIG. 1) and descending order of the hardness (FIG. 5).

Furthermore, the hard resin layer is preferably the hard sheet 300B. According to this preferred embodiment, it is possible to achieve high flatness while omitting a process of flattening the surface of the circuit module 10A and a process of curing the surface layer.

The above-described embodiments are only intended to easily understand the present disclosure, and are not intended to interpret the present disclosure limitedly. The present disclosure may be modified or improved without departing from the scope of the present disclosure, and the present disclosure also encompasses equivalents thereof. That is, the embodiments with appropriate design changes made by a person skilled in the art are also included in the scope of the present disclosure as long as those embodiments have the characteristics of the present disclosure. For example, elements of the embodiments, and the arrangement, materials, conditions, shapes, sizes, and the like, of the elements are not limited to the illustrated ones, and may be modified as needed. The embodiments are illustrative. Of course, partial replacement or combination of the components described in the different embodiments is possible, and these are also included in the scope of the present disclosure as long as these include the characteristics of the present disclosure.

10A to 10D circuit module
100 base sheet
200 resin layer
250 resin layer
300A hard resin layer
300B hard sheet
400 electronic component
R mounting region

The invention claimed is:

1. A circuit module comprising:
   a base having flexibility, the base having a mounting region in which an electronic component is mounted;
   a lower layer including a resin material, the lower layer being provided over a region other than the mounting region on the base; and
   a surface layer including a resin material different in hardness from the resin material of the lower layer, a periphery of the surface layer being spaced inwardly from an outer edge of the lower layer.

2. The circuit module according to claim 1, wherein
   the lower layer has such a shape that a thickness of a portion provided outside the mounting region decreases toward a periphery of the lower layer, and
   a contact angle of the periphery of the lower layer contacting with the base is an acute angle.

3. The circuit module according to claim 2, further comprising an intermediate layer including a resin material, the intermediate layer being provided between the lower layer and the surface layer, a periphery of the intermediate layer being located outside a region in which the surface layer is provided and inside the region in which the lower layer is provided, wherein
   the intermediate layer is provided such that a total thickness of the lower layer and the intermediate layer in the mounting region is at least partially larger than a thickness of the electronic component.

4. The circuit module according to claim 2, wherein layers are laminated in ascending order of hardness from the lower layer toward the surface layer.

5. The circuit module according to claim 2, wherein layers are laminated in descending order of hardness from the lower layer toward the surface layer.

6. The circuit module according to claim 2, wherein the surface layer is a hard sheet.

7. The circuit module according to claim 1, further comprising an intermediate layer including a resin material, the intermediate layer being provided between the lower layer and the surface layer, a periphery of the intermediate layer being located outside a region in which the surface layer is provided and inside the region in which the lower layer is provided, wherein
   the intermediate layer is provided such that a total thickness of the lower layer and the intermediate layer in the mounting region is at least partially larger than a thickness of the electronic component.

8. The circuit module according to claim 7, wherein layers are laminated in ascending order of hardness from the lower layer toward the surface layer.

9. The circuit module according to claim 7, wherein layers are laminated in descending order of hardness from the lower layer toward the surface layer.

10. The circuit module according to claim 7, wherein the surface layer is a hard sheet.

11. The circuit module according to claim 1, wherein layers are laminated in ascending order of hardness from the lower layer toward the surface layer.

12. The circuit module according to claim 11, wherein the surface layer is a hard sheet.

13. The circuit module according to claim 1, wherein layers are laminated in descending order of hardness from the lower layer toward the surface layer.

14. The circuit module according to claim 1, wherein the surface layer is a hard sheet.

15. The circuit module according to claim 1, wherein the surface layer is disposed over the mounting region and the lower layer.

* * * * *